United States Patent
Lee et al.

(10) Patent No.: US 10,510,287 B2
(45) Date of Patent: Dec. 17, 2019

(54) TRANSFER METHOD OF EXPANDING PITCHES OF DEVICE AND AN APPARATUS FOR PERFORMING THE SAME

(71) Applicant: Industrial Technology Research Institute, Hsinchu (TW)

(72) Inventors: Kang-Feng Lee, Taipei (TW); Yi-Tsung Pan, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 16/055,179

(22) Filed: Aug. 6, 2018

(65) Prior Publication Data

US 2019/0043416 A1 Feb. 7, 2019

Related U.S. Application Data

(60) Provisional application No. 62/542,250, filed on Aug. 7, 2017.

(51) Int. Cl.
  *G09G 3/32* (2016.01)
  *B41F 16/00* (2006.01)
  (Continued)

(52) U.S. Cl.
  CPC ............ *G09G 3/32* (2013.01); *B41F 16/00* (2013.01); *H01L 21/6836* (2013.01);
  (Continued)

(58) Field of Classification Search
  CPC .......... B41F 16/00; B82Y 40/00; G09G 3/32; H01L 21/6836; H01L 2221/68336;
  (Continued)

(56) References Cited

U.S. PATENT DOCUMENTS 5,540,147 A * 7/1996 Johnson .................. B41M 1/34
                                                                                                              101/151
7,943,491 B2    5/2011 Nuzzo et al.
(Continued)

FOREIGN PATENT DOCUMENTS

CN       104765193       7/2015
CN       106876293       6/2017
(Continued)

OTHER PUBLICATIONS

English translation of CN106876293.*
(Continued)

*Primary Examiner* — Sonya M Sengupta
(74) *Attorney, Agent, or Firm* — JCIPRNET

(57) ABSTRACT

A transfer method for expanding pitches of devices includes: providing a first substrate with micro devices having the pitches being a predetermined value in a first direction and a second direction; transferring the micro devices to a first roller by contacting it with the micro devices, wherein a pitch of contact line portions on the first roller is N times of the predetermined value; transferring the micro devices on the first roller to a second substrate; rotating the second substrate by 90 degrees; transferring the micro devices to a second roller by rolling the second roller to contact the micro devices; and then transferring the micro devices to a third substrate to expand the pitch of the micro devices in both the first and the second directions. The portions in contact with the micro devices all have adhesive layers with different adhesion operation windows.

36 Claims, 13 Drawing Sheets

(51) Int. Cl.
*H01L 21/683* (2006.01)
*B82Y 40/00* (2011.01)
*B29C 39/14* (2006.01)
*B29C 65/00* (2006.01)
*H01L 33/00* (2010.01)
*B44C 3/00* (2006.01)

(52) U.S. Cl.
CPC .............. *B29C 39/14* (2013.01); *B29C 66/92* (2013.01); *B44C 3/005* (2013.01); *B82Y 40/00* (2013.01); *H01L 33/0095* (2013.01)

(58) Field of Classification Search
CPC ....... H01L 2221/68354; H01L 25/0753; H01L 33/0095; B44C 3/005; B29C 39/14; B29C 66/92
USPC .......................... 156/230, 235, 241, 249, 358
See application file for complete search history.

(56) References Cited

U.S. PATENT DOCUMENTS

| | | | |
|---|---|---|---|
| 8,012,652 B2 | 9/2011 | Kim et al. | |
| 8,277,593 B2* | 10/2012 | Kim | B41N 1/06 156/232 |
| 8,354,220 B2 | 1/2013 | Kim et al. | |
| 8,573,469 B2 | 11/2013 | Hu et al. | |
| 2012/0223875 A1 | 9/2012 | Lau et al. | |
| 2013/0126081 A1 | 5/2013 | Hu et al. | |
| 2014/0091993 A1 | 4/2014 | Lau et al. | |
| 2016/0111604 A1 | 4/2016 | Li et al. | |
| 2017/0054390 A1 | 2/2017 | Chen et al. | |
| 2017/0165952 A1* | 6/2017 | Hoffman | B32B 38/0036 |

FOREIGN PATENT DOCUMENTS

| | | |
|---|---|---|
| TW | 200600346 | 1/2006 |
| WO | 2017200164 | 11/2017 |

OTHER PUBLICATIONS

English translation of TW200600346.*
English translation of WO2017/200164.*
English translation of CN104765193.*
Wing Cheung Chong, et al., "A Novel Full-Color 3LED Projection System using R-G-B Light Emitting Diodes on Silicon (LEDoS) Micro-displays," SID Symposium Digest of Technical Papers, vol. 44, Issue 1, Jul. 2013, pp. 1-4.
Deng Peng, et al., "Full-Color Pixelated-Addressable Light Emitting Diode on Transparent Substrate (LEDoTS) Micro-Displays by CoB," Journal of Display Technology, vol. 12, No. 7, Jul. 2016, pp. 742-746.
Zhao Jun Liu, et al., "Active Matrix Programmable Monolithic Light Emitting Diodes on Silicon (LEDoS) Displays," SID Symposium Digest of Technical Papers, vol. 42, Issue 1, Aug. 2012, pp. 1215-1218.
Minwoo Choi, et al., "Stretchable Active Matrix Inorganic Light-Emitting Diode Display Enabled by Overlay-Aligned Roll-Transfer Printing," Advanced Functional Materials, vol. 27, Issue 11, Feb. 2017, pp. 1-10.
Sang Yoon Yang, et al., "Elastomer Surfaces with Directionally Dependent Adhesion Strength and Their Use in Transfer Printing with Continuous Roll-to-Roll Applications," Advanced Materials, vol. 24, Issue 16, Mar. 2012, pp. 2117-2122.
Chan Kim, et al., "Ultimate Control of Rate-Dependent Adhesion for Reversible Transfer Process via a Thin Elastomeric Layer" ACS Appl. Mater. Interfaces, vol. 9, Issue 14, Mar. 2017, pp. 12886-12892.

* cited by examiner

TRANSFER METHOD OF EXPANDING PITCHES OF DEVICE AND AN APPARATUS FOR PERFORMING THE SAME

CROSS-REFERENCE TO RELATED APPLICATION

This application claims the priority benefit of U.S. provisional application Ser. No. 62/542,250, filed on Aug. 7, 2017. The entirety of the above-mentioned patent application is hereby incorporated by reference herein and made a part of this specification.

TECHNICAL FIELD

The disclosure relates to a transfer method for expanding pitches of devices and an apparatus for performing the transfer method.

BACKGROUND

The micro LED display is one of the most discussed techniques among the next-generation display techniques. Particularly, it has the greatest potential in applications such as display for hand-held device, TV wall large-size indoor displays, AR/VR display devices, etc.

However, to be put to mass production, further development in the manufacturing process of the micro LED display is still required. For example, since micro devices (R/G/B) of the micro LED display have a small thickness and a small pitch, the conventional method of individual bonding cannot be adopted. Moreover, in addition to the requirement for position precision, the process of assembling the micro devices should also meet the speed requirement. However, due to the limitation of mass production, there is currently no perfect solution for rapidly and massively performing operations of pitch expansion and picking/placing of devices. Even though electrostatic picking/placing techniques have been developed, such techniques require complex and rapid high-precision mechanisms, and their overall costs for mass production cannot meet the expectation of the market.

SUMMARY

A transfer method for expanding pitches of devices of the disclosure includes the following steps. A first substrate with a plurality of micro devices is provided, wherein a pitch of the micro devices on the first substrate in a first direction and a second direction is a predetermined value, and a first adhesive layer is provided between the first substrate and the micro devices. Then, the micro devices are transferred to a first roller by rolling the first roller to contact the micro devices on the first substrate, wherein the first roller includes a plurality of contact line portions, a pitch of the contact line portions is N times of the predetermined value, and a second adhesive layer is provided on surfaces of the contact line portions. Next, the micro devices on the first roller are transferred to a second substrate, wherein a third adhesive layer is provided on a surface of the second substrate. The second substrate is rotated by 90 degrees. Afterwards, the micro devices are transferred to a second roller by rolling the second roller to contact the micro devices on the second substrate, wherein a fourth adhesive layer is provided on a surface of the second roller. Next, the micro devices on the second roller are transferred to a third substrate, wherein a fifth adhesive layer is provided on a surface of the third substrate.

A transfer apparatus for expanding pitches of devices of the disclosure is configured to transfer and expand a pitch of a plurality of micro devices located on a substrate, wherein a pitch of the micro devices in a first direction and a second direction is a predetermined value. The apparatus includes a first roller, a temporary substrate, a moving apparatus, and a second roller. The first roller includes a plurality of contact line portions, and a pitch of the contact line portions is N times of the predetermined value. The first roller is configured to roll to contact the micro devices on the substrate to transfer the micro devices to the contact line portions. The temporary substrate is configured to carry the micro devices transferred from the contact line portions. The moving apparatus is configured to rotate the temporary substrate with the micro devices by 90 degrees. The second roller is configured to roll to contact the micro devices on the temporary substrate to transfer the micro devices to the second roller.

In light of the above, the method of the disclosure adopts two-step roller transfer and rotates the temporary substrate by 90 degrees to rapidly and massively perform pitch expansion and transfer of the micro devices in a simple and low-cost manner. Therefore, the method is applicable to mass production.

Several exemplary embodiments accompanied with figures are described in detail below to further describe the disclosure in details.

BRIEF DESCRIPTION OF THE DRAWINGS

The accompanying drawings are included to provide a further understanding of the disclosure and are incorporated in and constitute a part of this specification. The drawings illustrate exemplary embodiments of the disclosure and, together with the description, serve to explain the principles of the disclosure.

DETAILED DESCRIPTION

Figure 1A:
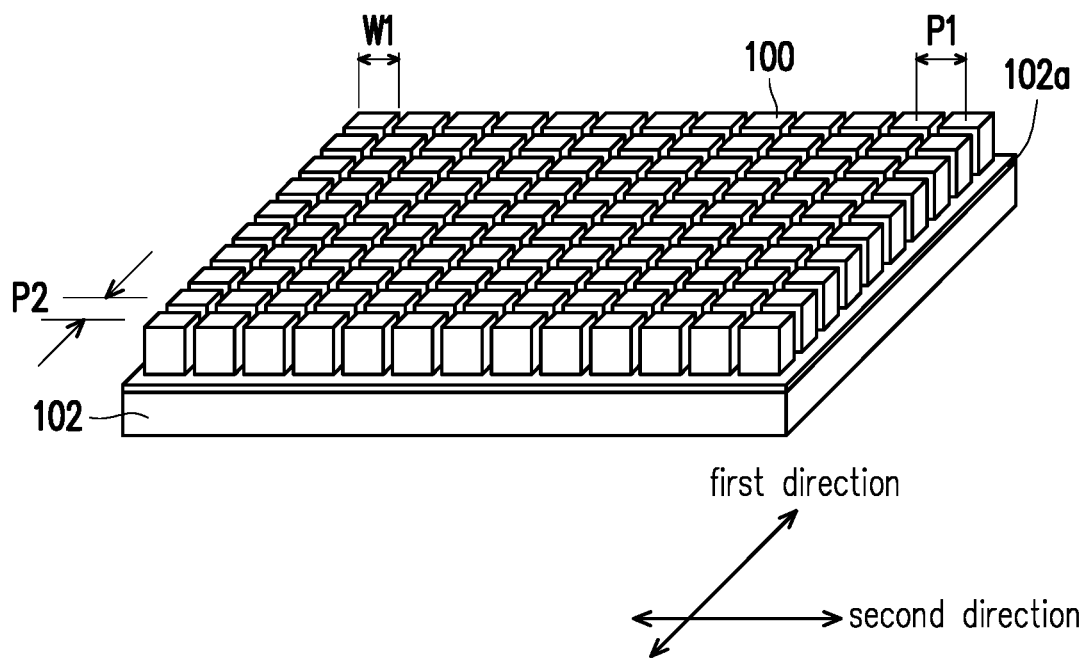
FIG. 1A to FIG. 1F are schematic diagrams illustrating a transfer process for expanding pitches of devices according to a first embodiment of the disclosure.

A description accompanied with drawings is provided in the following to sufficiently explain embodiments of the disclosure. However, the disclosure may still be implemented in many other different forms and should not be construed as limited to the embodiments described herein-after. In the drawings, for clarity, the components and their relative proportions may not be illustrated based on their actual sizes.

FIG. 1A to FIG. 1F are schematic diagrams illustrating a transfer process for expanding pitches of devices according to a first embodiment of the disclosure.

Referring to FIG. 1A, the transfer method for expanding pitches of devices of the present embodiment is applicable to various manufacturing processes for expanding pitches of devices (e.g., a micro device (R/G/B) assembly process of a micro LED display), but the disclosure is not limited thereto. Any manufacturing process that requires precise positioning and rapid and mass operations of pitch expansion and picking/placing of devices may use the method described in the present embodiment. In the present embodiment, a first substrate 102 with a plurality of micro devices 100 is first provided. The material of the first substrate 102 is, for example, a non-deformable inorganic material to reduce variations in the position of the micro devices 100 on the first substrate 102 resulting from variations in the environmental temperature or humidity. Moreover, a pitch P1 and a pitch P2 of the micro devices 100 on the first substrate 102 in a second direction and a first direction are predetermined values. Herein, the "pitch" refers to a distance between central points of two adjacent micro devices 100 in one single direction. Since a gap must be present between the micro devices 100, the pitches P1 and P2 are generally slightly larger than a width W1 of the micro device 100. In addition, in the example of the micro devices of the micro LED display, a method of providing the micro devices 100 may be as follows. A plurality of micro devices of the same color are first simultaneously manufactured on a whole semiconductor substrate. Then, the micro devices are separated by laser cutting or dry etching, for example. Next, the micro devices are transferred onto the first substrate 102, and before the transfer, an adhesive layer 102a is coated on the surface of the first substrate 102 to increase the adhesion force between the first substrate 102 and the micro devices 100. Specifically, the adhesive layer 102a is a pressure-sensitive adhesive such as a UV release film. Therefore, after the pressure-sensitive adhesive is subjected to a light or heat stimulus, cross-linking reaction occurs or gas is generated such that the adhesive force of the pressure-sensitive adhesive is reduced. For example, the adhesive force of the UV release film before de-adhesion is greater than the adhesive force after de-adhesion.

Figure 1B:
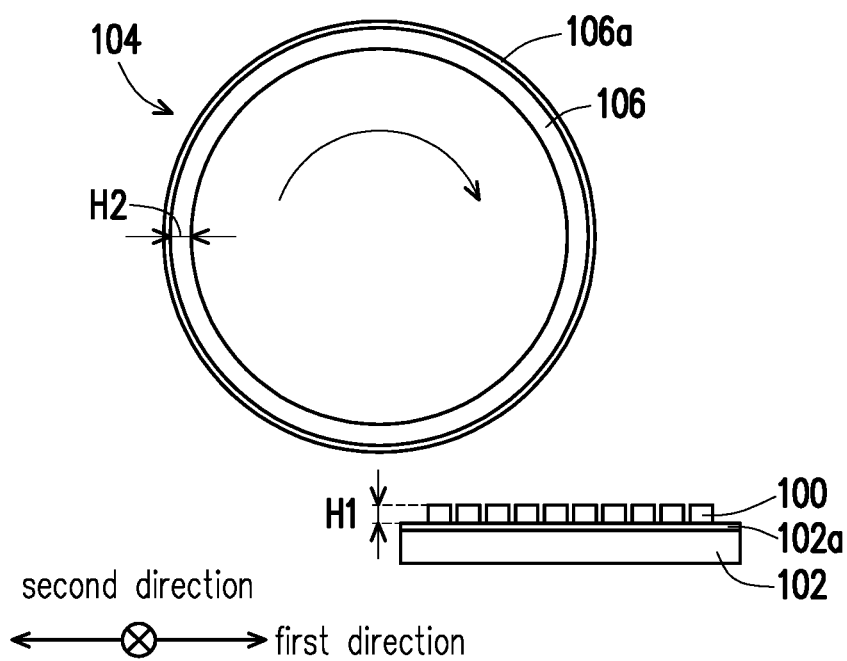

Next, referring to FIG. 1B, by rolling a first roller 104 to contact the micro devices 100 on the first substrate 102, the micro devices 100 are transferred to the first roller 104. Specifically, the first roller 104 includes contact line portions 106 radially arranged thereon. An adhesive layer 106a is coated on the surfaces of the contact line portions, and the adhesive layer 106a is a pressure-sensitive adhesive. In the present embodiment, the adhesion force of the adhesive layer 106a is greater than the adhesion force of the adhesive layer 102a after being subjected to a light or heat stimulus, and the adhesion force may be an adhesive force, an electrostatic force, a pressure, or a Van der Waals force. For example, the adhesive layer 106a may use another adhesive material having a viscosity operation window different from that of the adhesive layer 102a to pick up the micro devices 100 on the first substrate 102 by adhesion. One example is a pressure-sensitive adhesive (PSA) having an adhesive force between the adhesive forces of the UV release film before light irradiation (before transfer) and after light irradiation. In an embodiment, a rolling speed of the first roller 104 matches a speed at which the first substrate 102 is moved in an extension direction (i.e., the first direction) of the contact line portions 106, such that mass production can be performed.

Figure 2A:
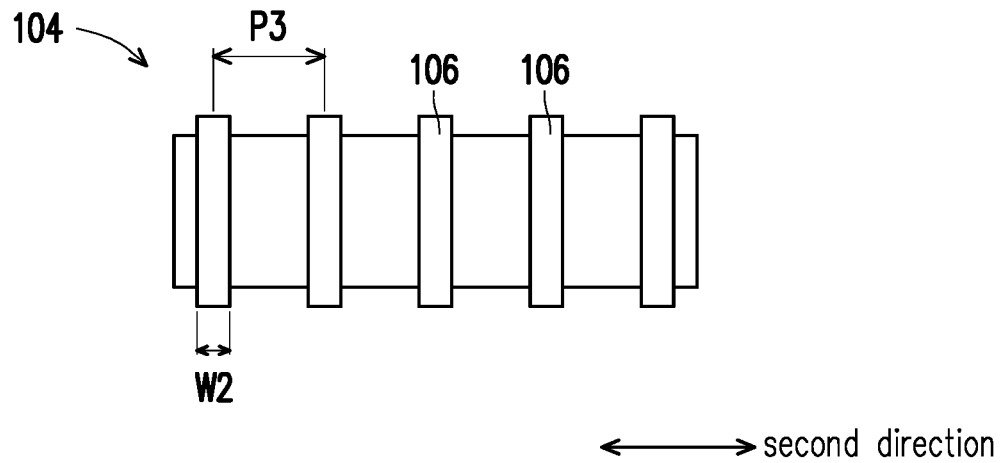
FIG. 2A is a schematic diagram illustrating a roller used in the first embodiment.

Moreover, since FIG. 1B is a side view in the first direction, only one contact line portion 106 is shown, and the contact line portion 106 is a continuous line. However, in a side view (see FIG. 2A) in the second direction, a plurality of contact line portions 106 are observed, and a pitch P3 of the contact line portions 106 is N times of P1, namely, N times of the predetermined value (N is a positive real number larger than or equal to 1). A width W2 of the contact line portion 106 may be equal to or greater than the width W1 of the micro device 100 to enhance the strength by which the contact line portions 106 pick up or adhere to the micro devices 100. In addition, a height H2 of the contact line portion 106 may be, for example, equal to or greater than a height H1 of the micro device 100 to enhance the operation quality at the time when the contact line portions 106 pick up or adhere to the micro devices 100.

Figure 2B:
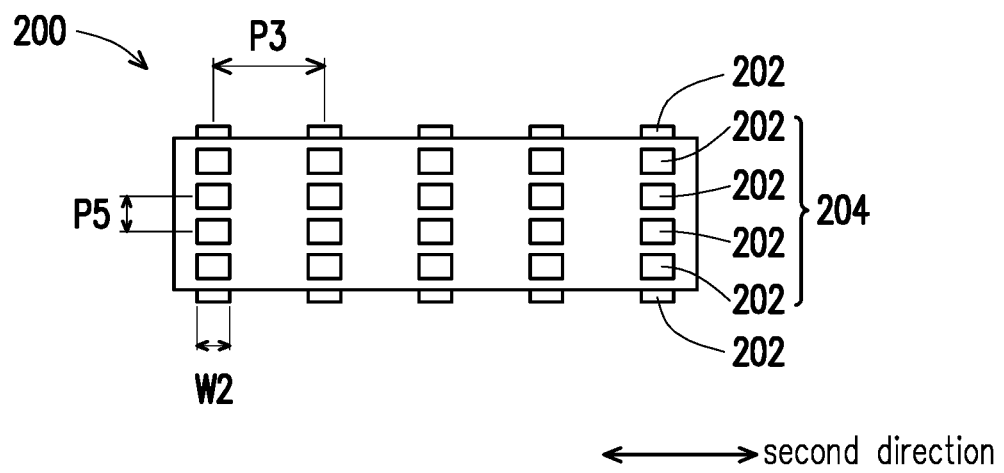
FIG. 2B is a schematic diagram illustrating another roller used in the first embodiment.

Other modifications may be further made to the first roller 104. For example, in a roller 200 shown in FIG. 2B, a contact line portion 204 is formed of a plurality of first protrusions 202. A pitch P5 of the first protrusions 202 is equal to the pitch P2 (i.e., the predetermined value) of the micro devices 100. In other words, when the roller 200 rolls in the first direction and contacts the micro devices 100, each of the micro devices 100 adheres to one of the first protrusions 202.

Figure 1C:
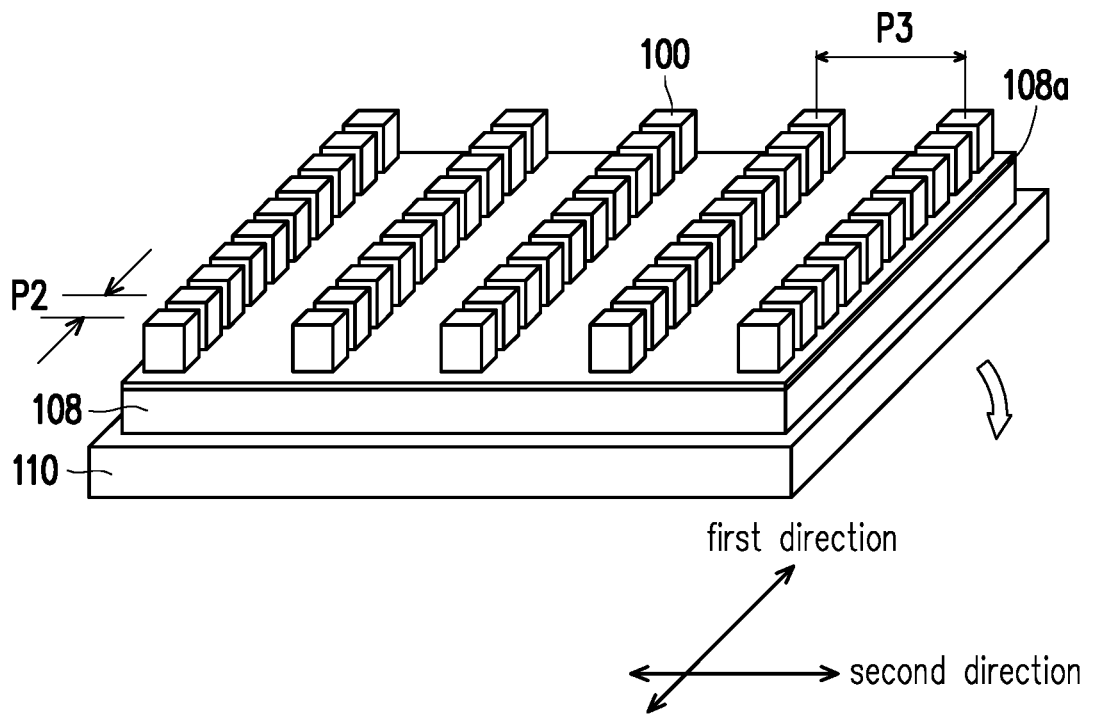

After the micro devices 100 are transferred to (the contact line portions 106 of) the first roller 104, referring to FIG. 1C, the micro devices 100 of the first roller 104 are transferred to a second substrate 108 (a temporary substrate). An adhesive layer 108a is coated on the surface of the second substrate 108. Specifically, the adhesive layer 108a is a pressure-sensitive adhesive, and the material of the second substrate 108 is selected, for example, to match the coefficient of thermal expansion (CTE) of the first substrate 102. In the present embodiment, the adhesion force of the adhesive layer 108a is greater than the adhesion force of the adhesive layer 106a, and the adhesion force may be an adhesive force, an electrostatic force, a pressure, or a Van der Waals force. For example, the adhesive layer 108a may use another adhesive material having a viscosity operation window different from that of the adhesive layer 106a to pick up the micro devices 100 on the contact line portions 106 by adhesion. One example is a UV release film, which has an adhesive force before UV light irradiation greater than the adhesive force of the pressure-sensitive adhesive. In FIG. 1C, the pitch P2 in the first direction of the micro devices 100 transferred onto the second substrate 108 is the predetermined value, and the pitch P3 in the second direction is N times of P1. Therefore, in this stage, expansion of the pitch of the micro devices 100 by N times in the second direction is completed.

Figure 1D:
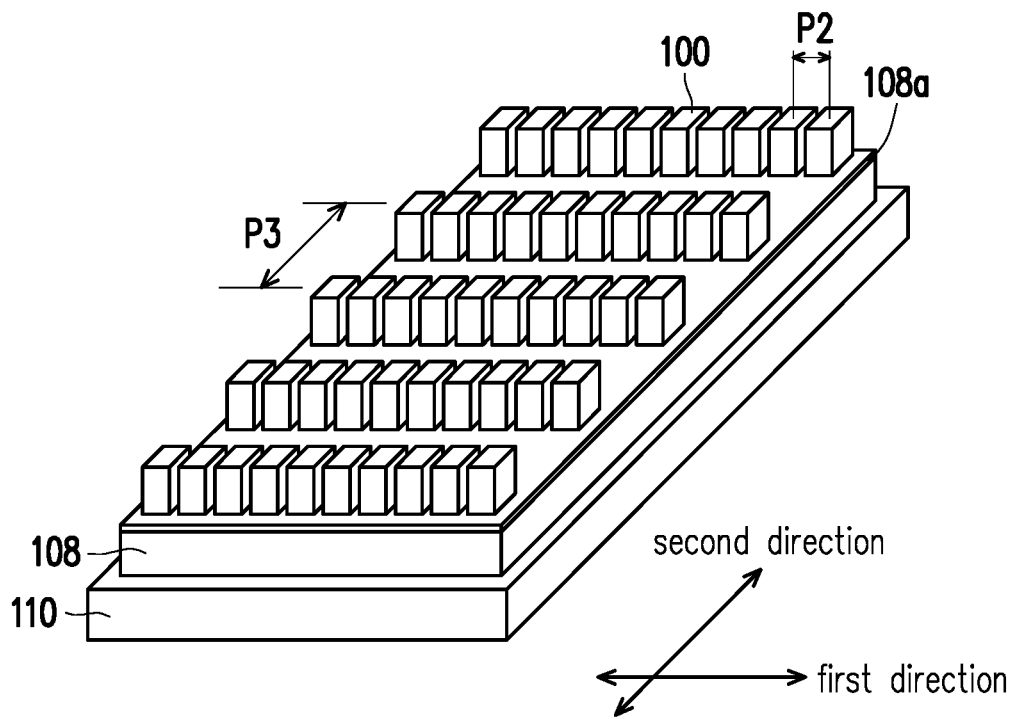

Next, the second substrate 108 is rotated by 90 degrees by using a moving apparatus 110 to obtain the result shown in FIG. 1D. The moving apparatus 110 is not specifically limited herein. Any apparatus capable of rotating the second substrate 108 by 90 degrees is applicable to the disclosure. Therefore, in addition to the plate-shaped apparatus shown in FIG. 1C, a robotic arm, a rotating robot, a linear robot, or a combination of these apparatuses may also be used to complete the operation of rotating the second substrate 108 by 90 degrees.

Figure 1E:
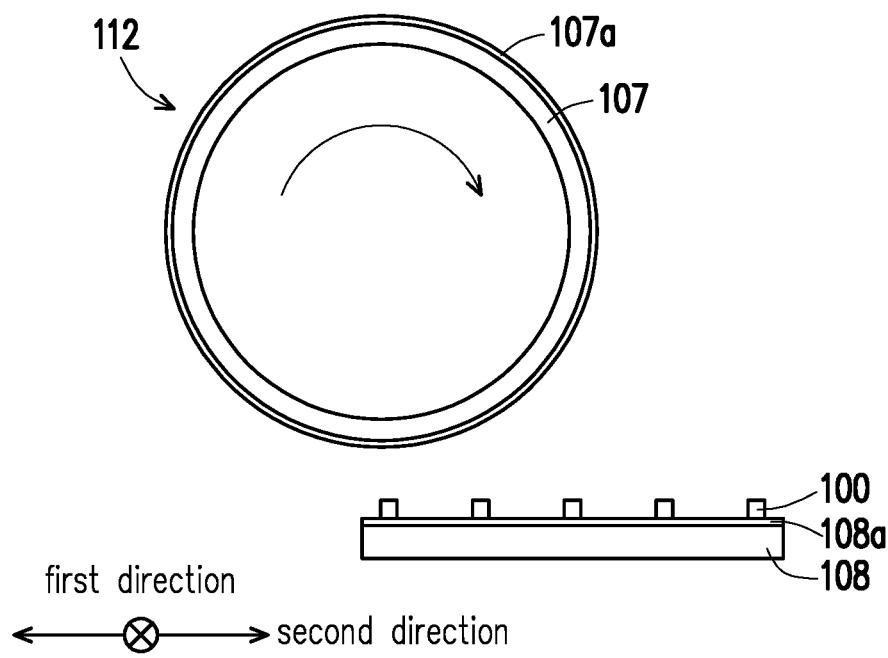
Figure 2C:
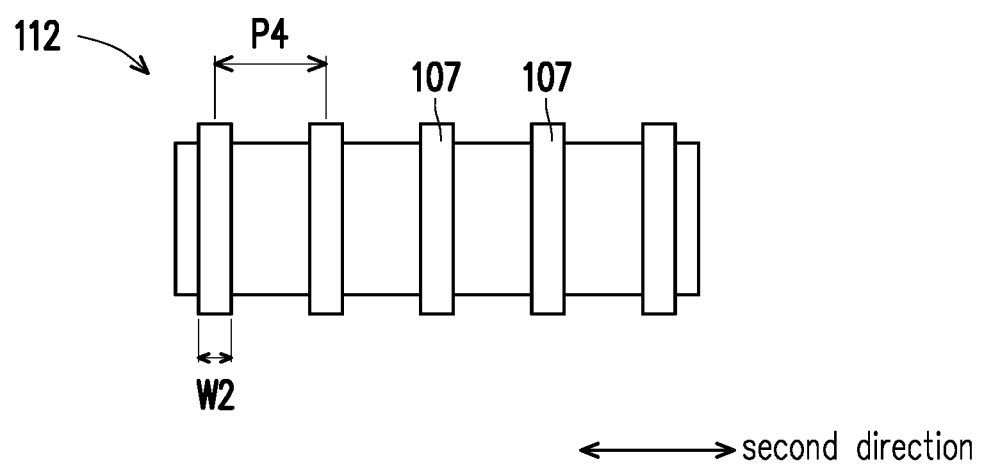
FIG. 2C is a schematic diagram illustrating yet another roller used in the first embodiment.

Then, referring to FIG. 1E, in the present embodiment, a second roller 112 is used to again roll and contact the micro devices 100 on the second substrate 108, wherein the second roller 112 includes contact line portions 107 radially arranged thereon, an adhesive layer 107a is coated on the surfaces of the contact line portions 107, and the adhesive layer 107a is a pressure-sensitive adhesive. In a side view (see FIG. 2C) in the second direction, a plurality of contact line portions 107 are observed, and a pitch P4 of the contact line portions 107 is M times of P2, namely, M times of the predetermined value (M is a positive real number larger than or equal to 1). Since the second roller 112 rolls in the second direction, only the micro devices 100 having the pitch P4 will be transferred to the contact line portions 107 in the first direction. Similar to the first roller 104, the rolling direction of the second roller 112 is not changed in the whole process of the present embodiment. The directions labeled in the drawings represent the arrangement directions of the micro devices 100. Therefore, what is changed is the arrangement direction of the micro devices 100.

In the present embodiment, the adhesion force of the adhesive layer 107a is greater than the adhesion force of the adhesive layer 108a after being subjected to a light or heat stimulus, and the adhesion force may be an adhesive force, an electrostatic force, a pressure, or a Van der Waals force. For example, the adhesive layer 107a may use another adhesive material having a viscosity operation window different from that of the adhesive material of the adhesive layer 108a to pick up the micro devices 100 on the second substrate 108 by adhesion. For example, if the adhesive layer 108a is a UV release film, the adhesive layer 107a may be a pressure-sensitive adhesive having an adhesive force between the adhesive forces of the UV release film before light irradiation (before transfer) and after light irradiation. Through light irradiation to the UV release film, the adhesiveness of the adhesive layer 108a is reduced.

Figure 1F:
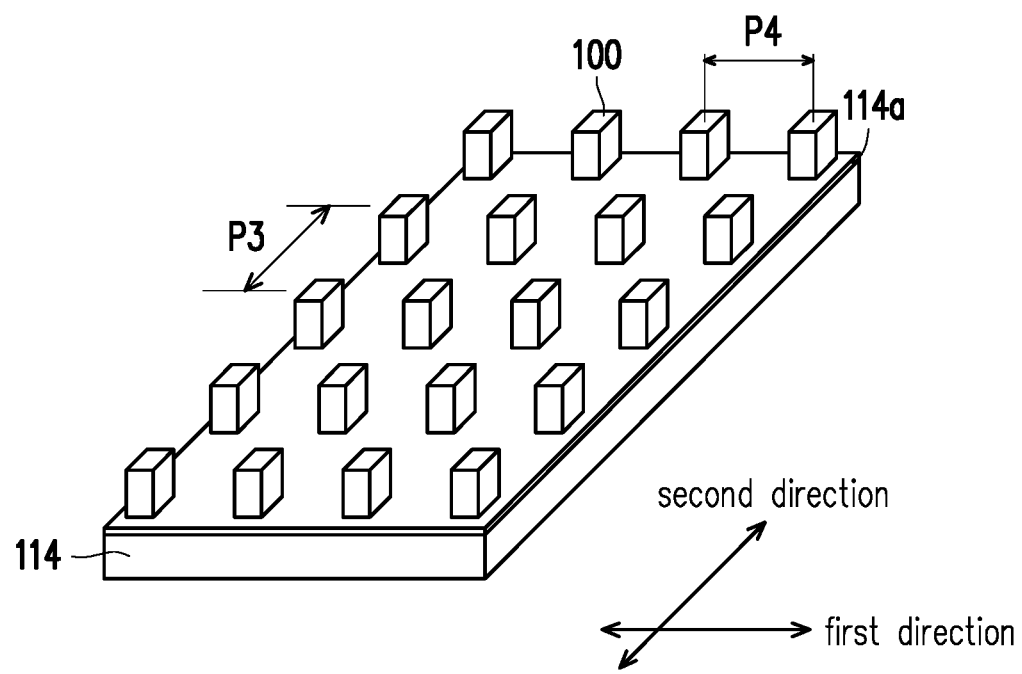

After the micro devices 100 are transferred to (the contact line portions 107 of) the second roller 112, referring to FIG. 1F, the micro devices 100 on the second roller 112 are transferred to a third substrate 114. An adhesive layer 114a is coated on the surface of the third substrate 114. The third substrate 114 may be a temporary substrate or a product substrate. If the third substrate 114 is a temporary substrate, the material is selected, for example, to match the coefficient of thermal expansion (CTE) of the first substrate 102. For example, the first substrate 102 and the third substrate 114 may be formed of the same material. Alternatively, the third substrate 114 is a product substrate having circuits and electrodes. In the present embodiment, the adhesion force of the adhesive layer 114a is greater than the adhesion force of the adhesive layer 107a, and the adhesion force may be an adhesive force, an electrostatic force, a pressure, or a Van der Waals force. For example, when the third substrate 114 is a product substrate having circuits and electrodes, the adhesive layer 114a may be an anisotropic conductive film (ACF) or an anisotropic conductive paste (e.g. self-assembly anisotropic conductive paste, SAP) to simultaneously achieve adhesion, electrical conduction, and self-assembly positioning. On the other hand, if the third substrate 114 is a temporary substrate, the UV release film may be used, and transfer to another product substrate may be performed in a subsequent process. For example, the micro devices 100 on the third substrate 114 may be first attached to a glass substrate, and a UV light is irradiated from the backside of the third substrate 114 to reduce the adhesiveness of the UV release film. Then, the third substrate 114 is peeled off.

In summary of the process of the first embodiment, the apparatus for implementing the first embodiment at least includes the first substrate 102, the first roller 104, the second substrate 108 (i.e., the temporary substrate), the second roller 112, and the moving apparatus 110. Table 1 below shows material selections of the components in the exemplary solution where the transfer of the micro devices is controlled by the adhesive force. However, the disclosure is not limited thereto.

TABLE 1

| Component | Material | Requirement |
| --- | --- | --- |
| first substrate | non-deformable inorganic material, e.g., glass, silicon wafer, quartz | reducing variations in position of micro devices thereon resulting from variations in environmental temperature or humidity |
| adhesive layer between first substrate and micro devices | UV release film manufactured by Nan Ya Plastics Corporation; glass adhesive force before de-adhesion may be adjusted to be 500 gf/25 mm to 2500 gf/25 mm, and glass adhesive force after de-adhesion may be reduced to 30 gf/25 mm or below | adhesive force before de-adhesion being greater than adhesive force after de-adhesion |
| first roller | e.g., stainless steel, anodic aluminum oxide | dimensionally stable material matching coefficient of thermal expansion (CTE) of first substrate |
| contact line portions | polydimethylsiloxane (PDMS) (adhesive force: 50 gf/25 mm to 100 gf/25 mm) | elastomer |
| adhesive layer on contact line portions | pressure-sensitive adhesive (adhesive force: 100 gf/25 mm to 200 gf/25 mm) | adhesive force being between adhesive forces of UV release film before light irradiation and after light irradiation |
| second substrate | glass, silicon wafer, quartz | transparent, dimensionally stable |

TABLE 1-continued

| Component | Material | Requirement |
|---|---|---|
| adhesive layer on second substrate | UV release film above | adhesive force before de-adhesion being greater than adhesive force of adhesive material on contact line portions |
| second roller | e.g., stainless steel, anodic aluminum oxide | dimensionally stable material matching coefficient of thermal expansion (CTE) of second substrate |
| contact line portions | PDMS | elastomer |
| adhesive layer on contact line portions | pressure-sensitive adhesive | adhesive force being between adhesive forces of UV release film before light irradiation and after light irradiation |
| third substrate | product substrate | transparent, flexible, dimensionally stable |
|  | glass | transparent, dimensionally stable |
| adhesive layer on third substrate | UV release film above | adhesive force before de-adhesion being greater than adhesive force of adhesive material on contact line portions |
|  | anisotropic conductive film (ACF) (peel strength at about 500 gf/25 mm) or Epowell AP series anisotropic conductive paste (SAP) (peel strength at about 4800 gf/25 mm) manufactured by Sekisui Chemical Co., Ltd. | conductive adhesive for adhesion, electrical conduction, and self-assembly positioning |

FIG. 3A to FIG. 3F are schematic diagrams illustrating a transfer process for expanding pitches of devices according to a second embodiment of the disclosure.

Figure 3A:
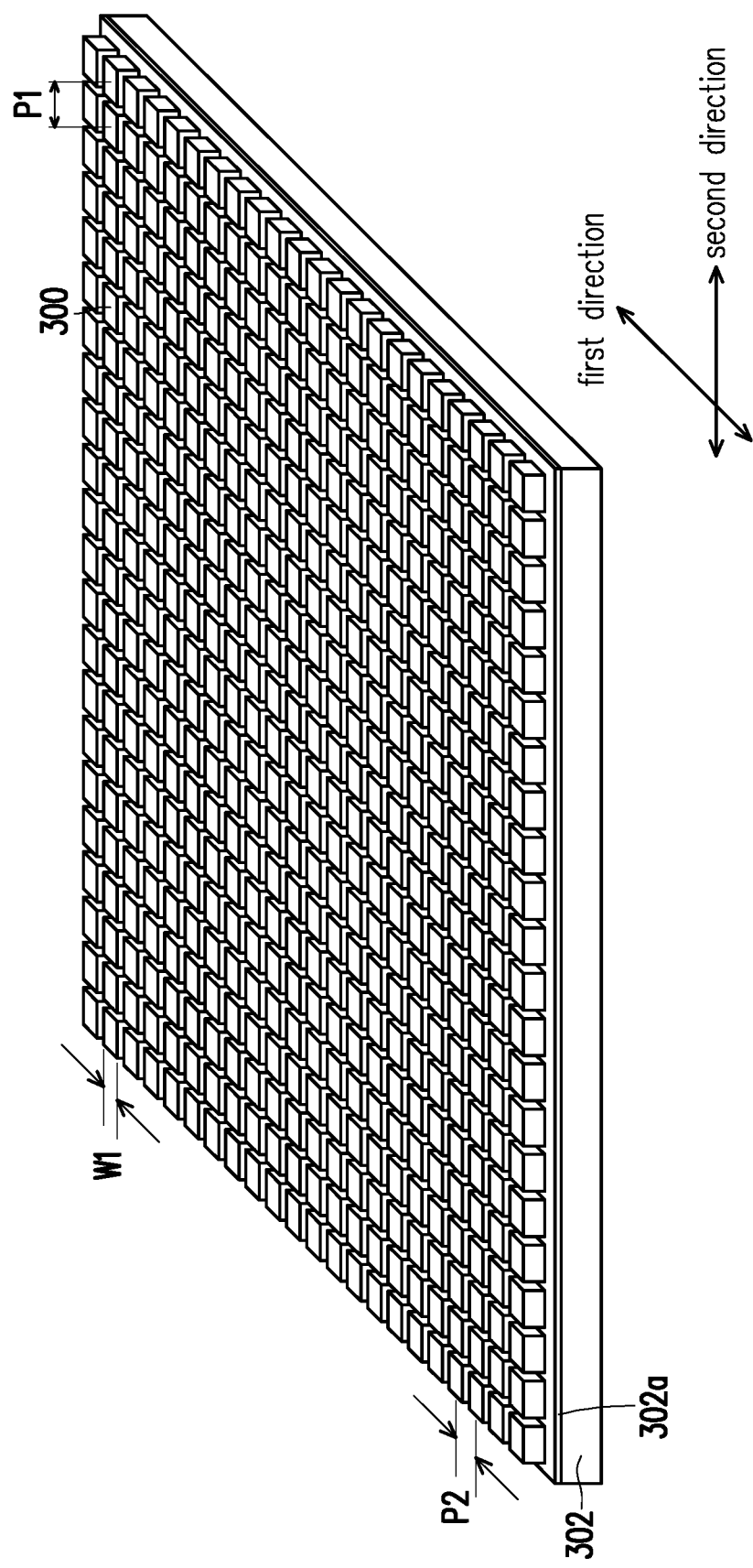
FIG. 3A to FIG. 3F are schematic diagrams illustrating a transfer process for expanding pitches of devices according to a second embodiment of the disclosure.

Referring to FIG. 3A, the transfer method for expanding pitches of devices of the present embodiment is similarly applicable to various manufacturing processes for expanding pitches of devices (e.g., a micro device (R/G/B) assembly process of a micro LED display), but the disclosure is not limited thereto. Any manufacturing process that requires precise positioning and rapid and mass operations of pitch expansion and picking/placing of devices may use the method described in the present embodiment. In the present embodiment, a first substrate 302 with a plurality of micro devices 300 is first provided. An adhesive layer 302a is coated on the surface of the first substrate 302. The material of the first substrate 302 is, for example, a non-deformable inorganic material to reduce variations in the position of the micro devices 300 on the first substrate 302 resulting from variations in the environmental temperature or humidity. Moreover, a pitch P1 and a pitch P2 of the micro devices 300 on the first substrate 302 in a first direction and a second direction are predetermined values. In addition, compared to the micro devices of the first embodiment, a thickness of the micro devices 300 is smaller, so the transfer process is more difficult. Reference may be made to the description of the first embodiment for the preparation of the micro devices 300, which shall not be repeatedly described here.

Figure 3B:
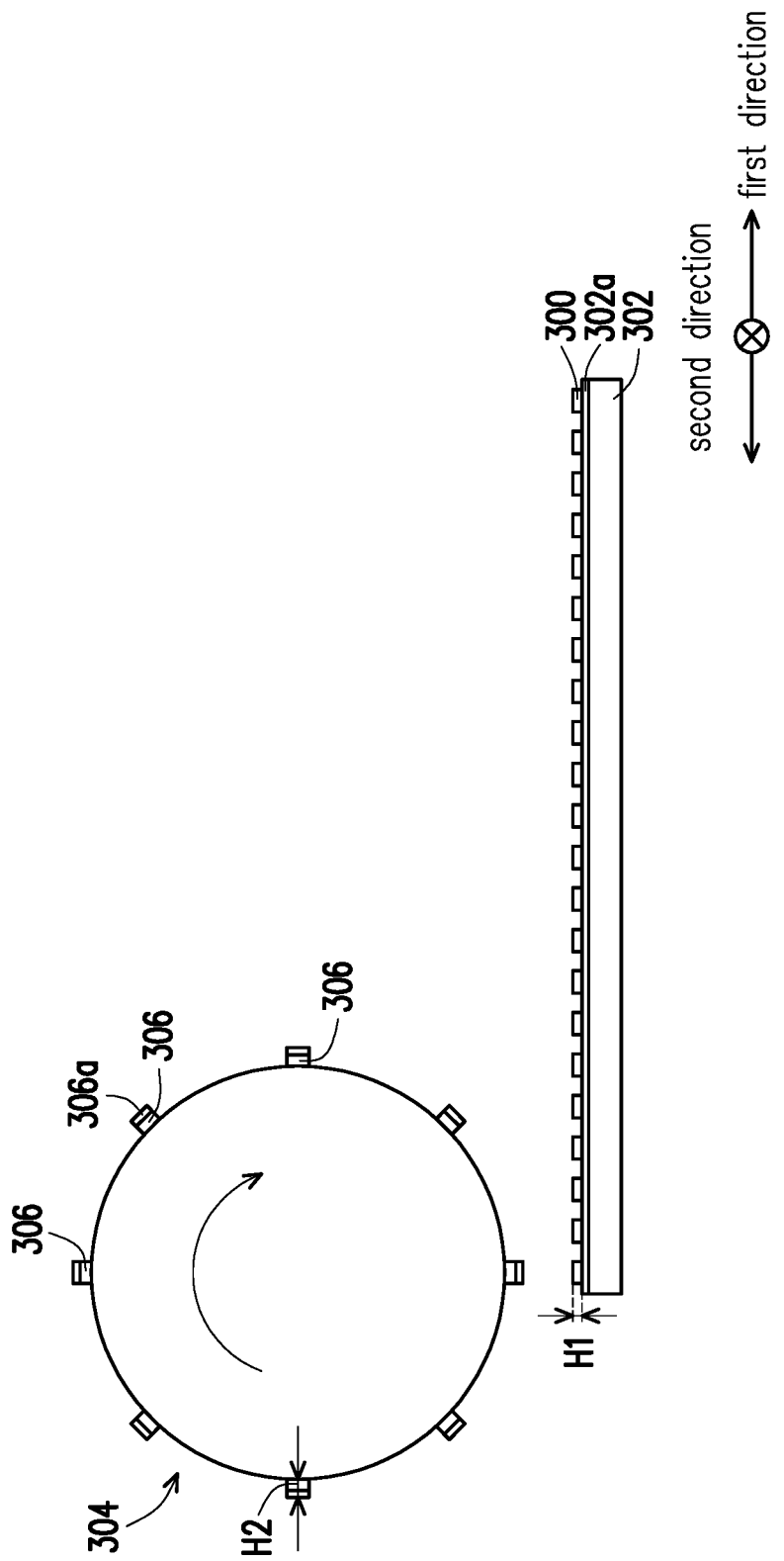
Figure 4A:
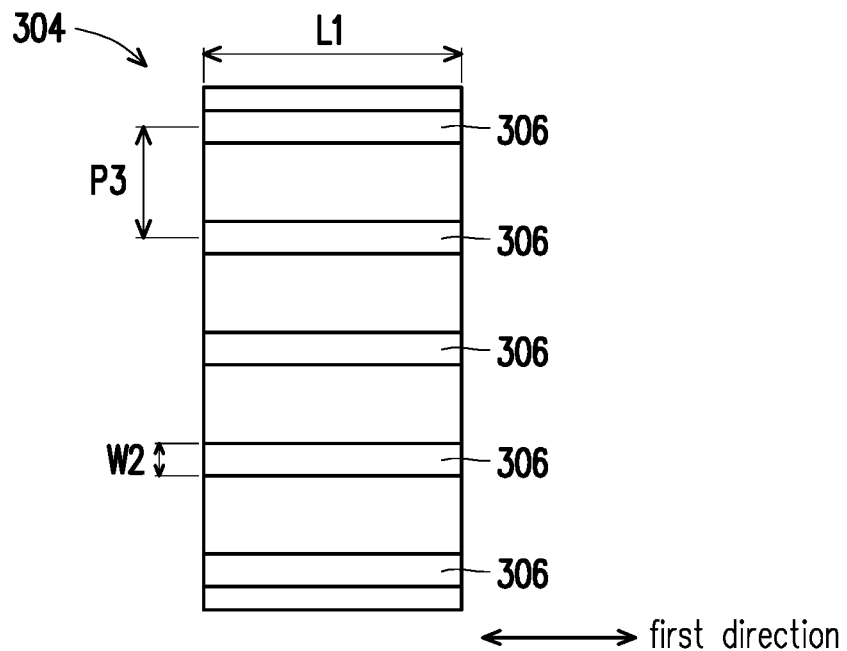
FIG. 4A is a schematic diagram illustrating a first roller used in the second embodiment.

Next, referring to FIG. 3B, by rolling a first roller 304 to contact the micro devices 300 on the first substrate 302, the micro devices 300 are transferred to the first roller 304. Specifically, the first roller 304 includes contact line portions 306 axially arranged thereon. An adhesive layer 306a is coated on the surfaces of the contact line portions 306. As FIG. 3B is a side view in the first direction, referring to FIG. 4A, which is a side view in the second direction, FIG. 4A shows a plurality of contact line portions 306, and each of the contact line portions 306 is a continuous line. A pitch P3 of the contact line portions 306 is N times of P2, namely, N times of the predetermined value (N is a positive real number larger than or equal to 1). A width W2 of the contact line portion 306 may be equal to or greater than a width W1 of the micro device 300 to enhance the strength by which the contact line portions 306 pick up or adhere to the micro devices 300. In addition, a height H2 of the contact line portion 306 may be equal to or greater than a height H1 of the micro device 300 to enhance the operation quality at the time when the contact line portions 306 pick up or adhere to the micro devices 300. Furthermore, a width L1 of the first roller 304 may be smaller than the width of the first substrate 302, and transfer of the micro devices 300 may be completed by repetitive picking/placing.

Figure 4B:
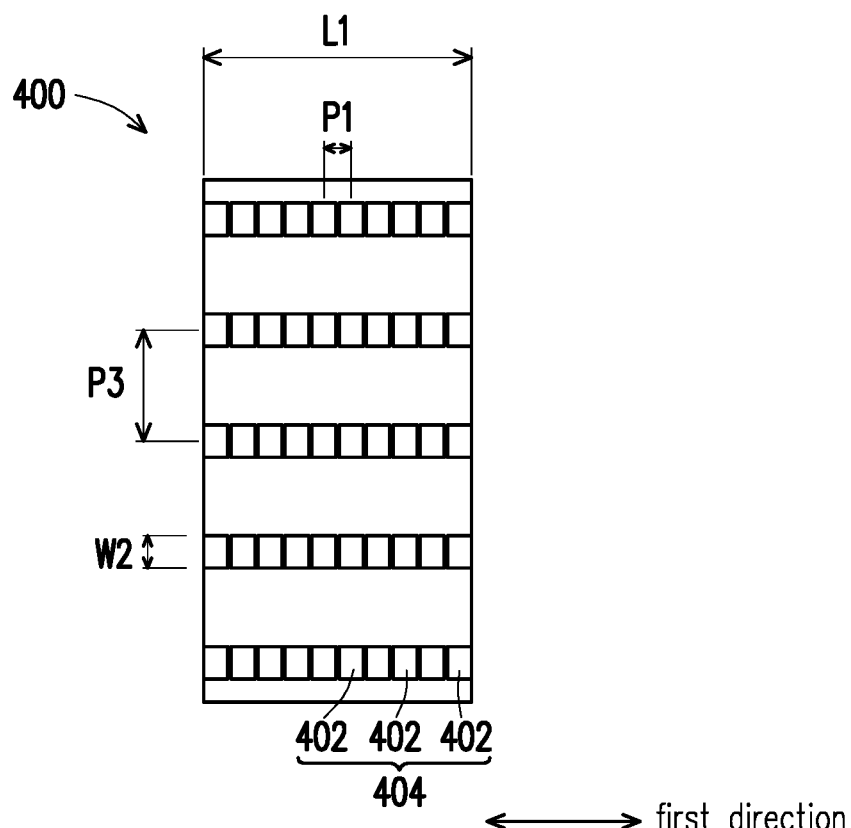
FIG. 4B is a schematic diagram illustrating another first roller used in the second embodiment.

Other modifications may be further made to the first roller 304. For example, in a roller 400 shown in FIG. 4B, a contact line portion 404 is formed of a plurality of first protrusions 402. A pitch of the first protrusions 402 is equal to the pitch P1 (i.e., the predetermined value) of the micro devices 300. In other words, when the roller 400 rolls in the first direction and contacts the micro devices 300, each of the micro devices 300 adheres to one of the first protrusions 402.

Referring to FIG. 3B, the adhesion force of the adhesive layer 306a is greater than the adhesion force of the adhesive layer 302a after being subjected to a light or heat stimulus, and the adhesion force may be an adhesive force, an electrostatic force, a pressure, or a Van der Waals force. For example, the adhesive layer 306a may use another adhesive material (e.g., a pressure-sensitive adhesive) having a viscosity operation window different from that of the adhesive layer 302a to pick up the micro devices 300 on the first substrate 302 by adhesion. In the second embodiment, a rolling speed of the first roller 304 matches a speed at which the first substrate 302 is moved in the first direction such that application to a production line is possible.

Figure 3C:
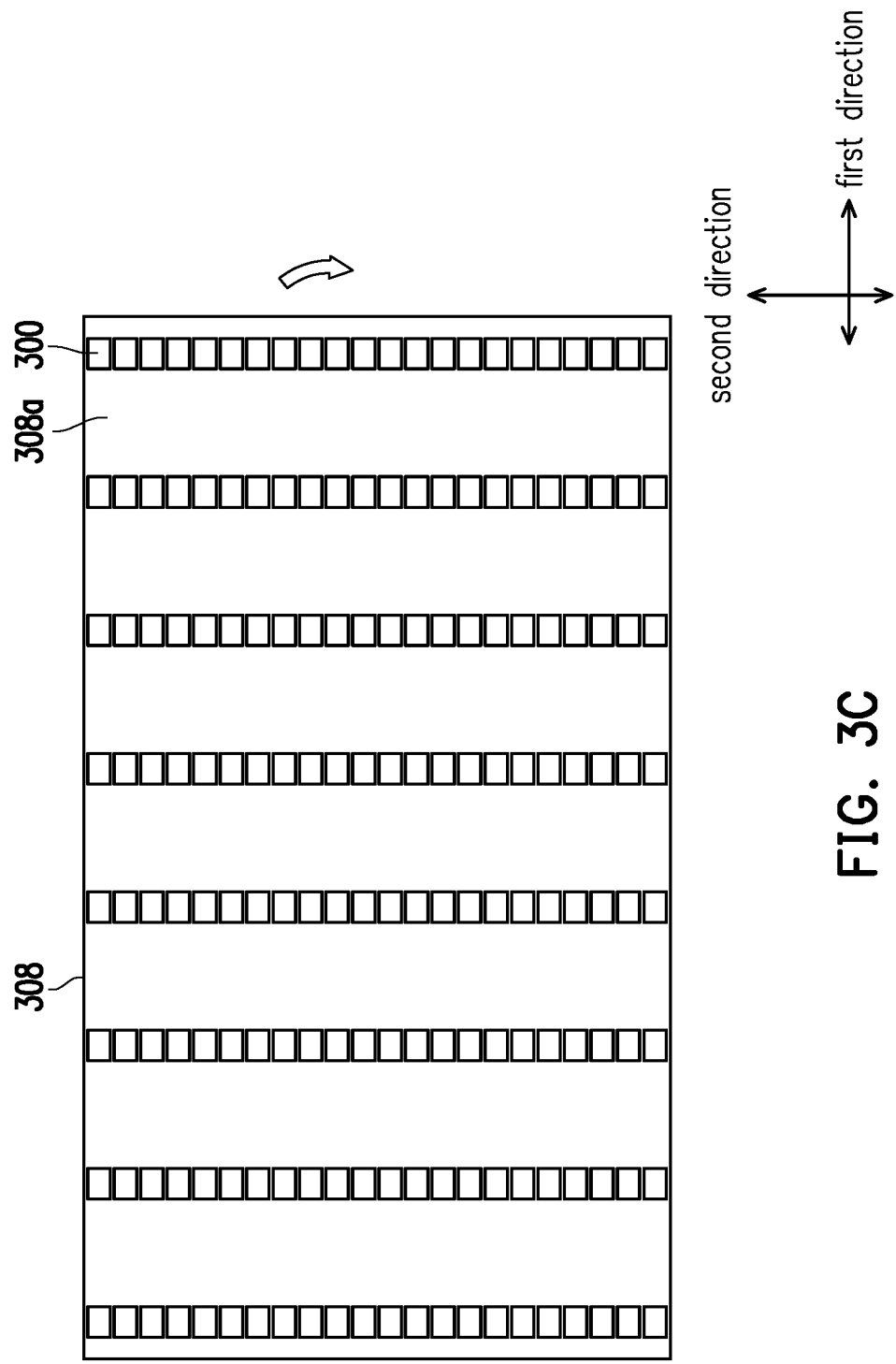

After the micro devices 300 are transferred to (the contact line portions 306 of) the first roller 304, referring to FIG. 3C, the micro devices 300 of the first roller 304 are transferred to a second substrate 308 (a temporary substrate). An adhesive layer 308a is coated on the surface of the second substrate 308. The material of the second substrate 308 is selected, for example, to match the coefficient of thermal expansion (CTE) of the first substrate 302. In the present embodiment, the adhesion force of the adhesive layer 308a is greater than the adhesion force of the adhesive layer 306a, and the adhesion force may be an adhesive force, an electrostatic force, a pressure, or a Van der Waals force. For example, another adhesive material having a viscosity operation window different from that of the adhesive layer 306a may be used on the second substrate 308 as the adhesive layer 308a to pick up the micro devices 300 on the contact line portions 306 by adhesion. One example is a UV release film, which has an adhesive force before UV light irradiation greater than the adhesive force of the pressure-sensitive adhesive. In FIG. 3C, the pitch P1 in the second direction of the micro devices 300 transferred onto the second substrate 308 is the predetermined value, and the pitch P3 in the first direction is N times of the predetermined value, P2. Therefore, in this stage, expansion of the pitch of the micro devices 300 by N times in the first direction is completed.

Figure 3D:
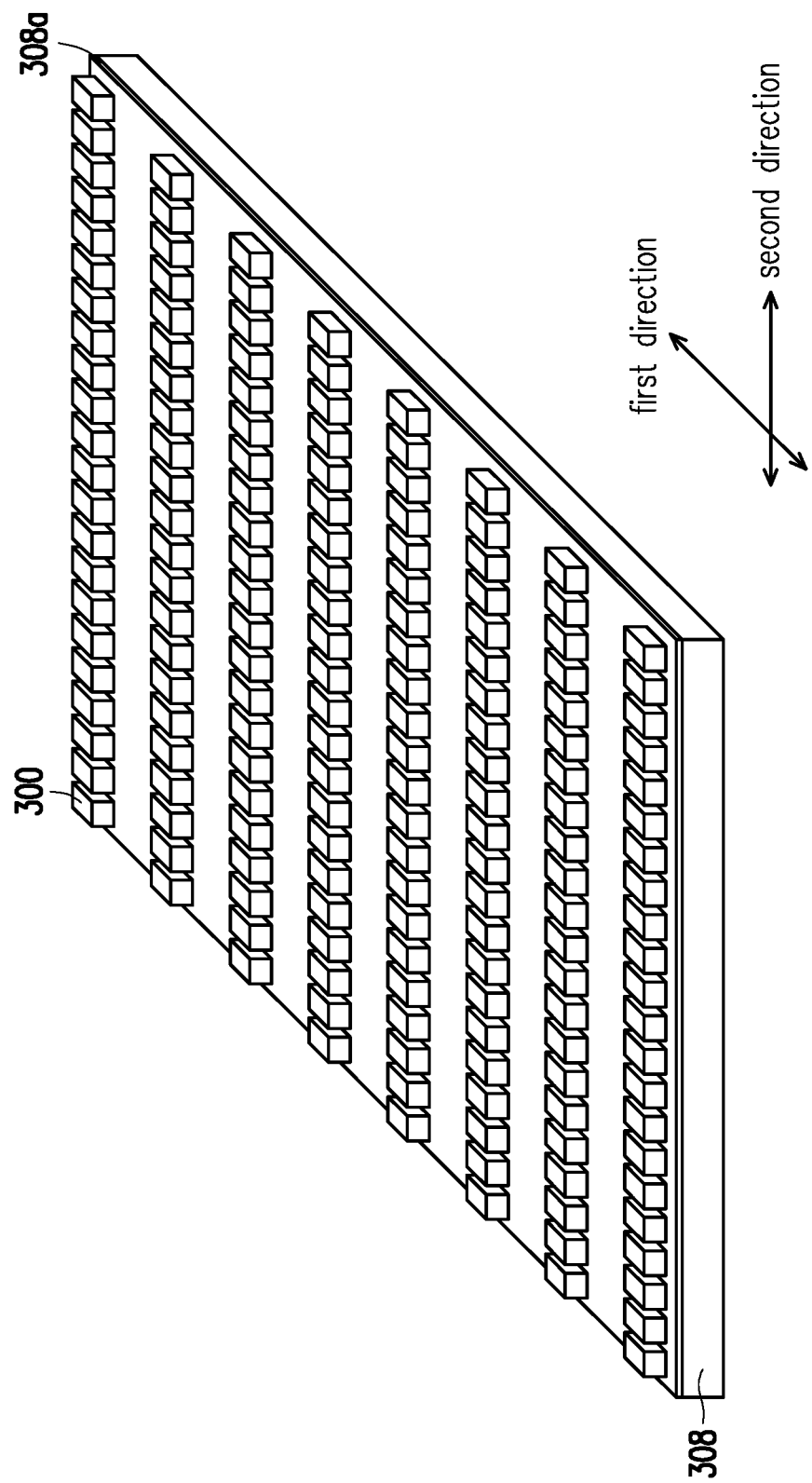

Next, the second substrate 308 is rotated by 90 degrees to obtain the result shown in FIG. 3D. Moreover, rotation of the second substrate 308 by 90 degrees may be performed by using a moving apparatus such as a carrier and a robotic arm (for example, using a combination of a rotating robot and a linear robot) and is not specifically limited herein.

Figure 3E:
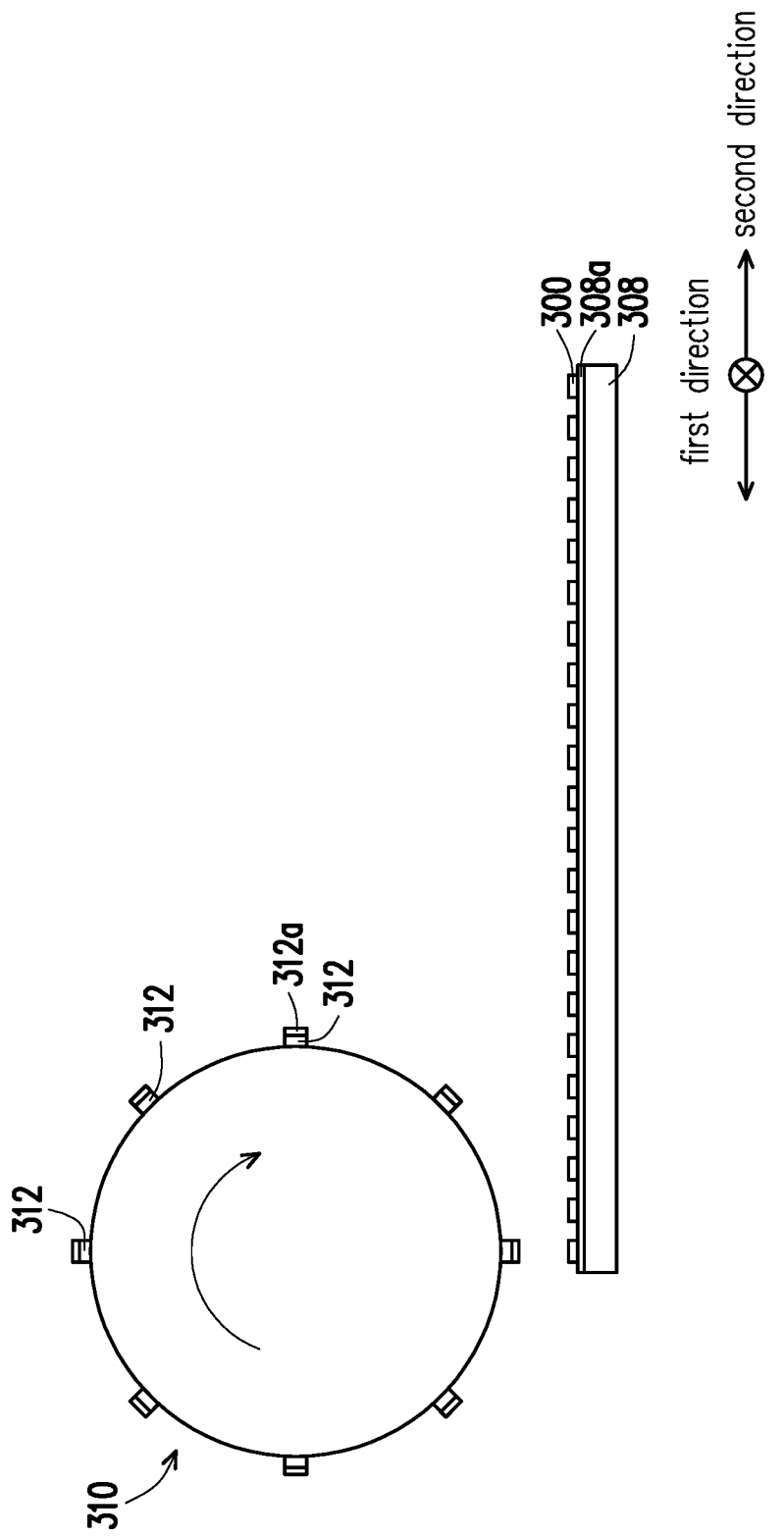
Figure 4C:
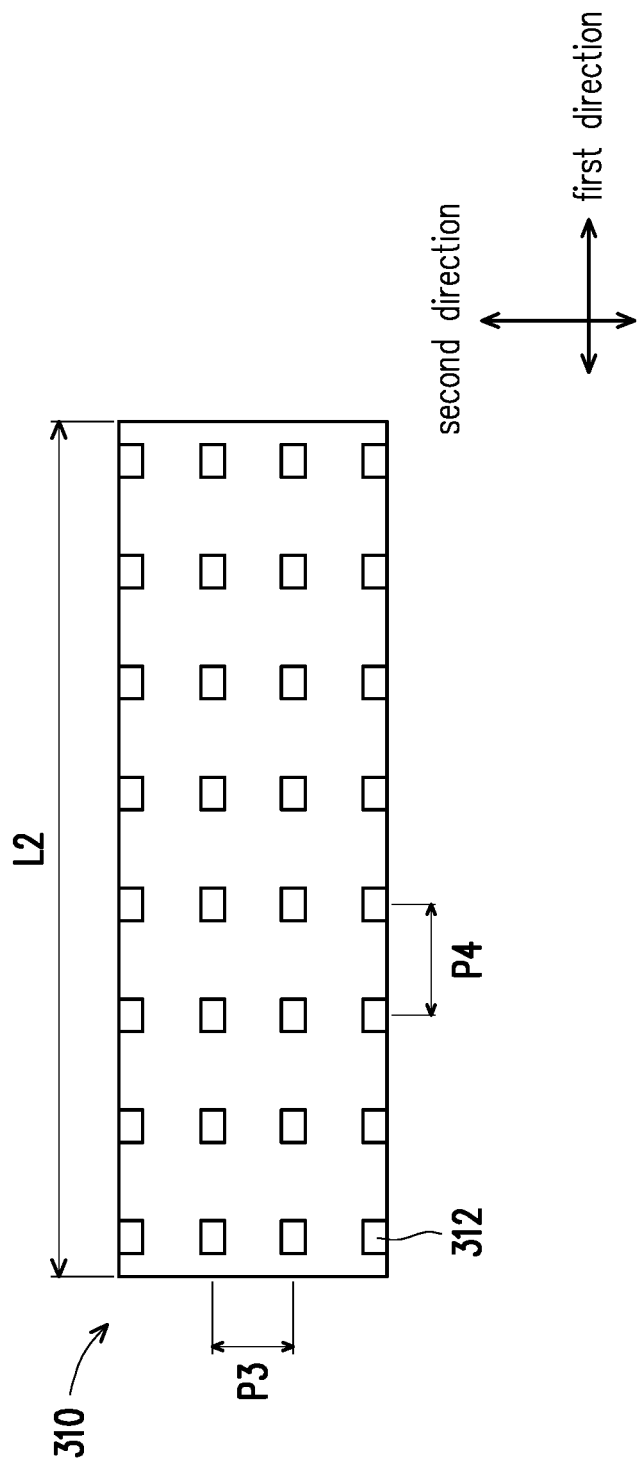
FIG. 4C is a schematic diagram illustrating a second roller used in the second embodiment.

Then, referring to FIG. 3E, by rolling a second roller 310 to contact the micro devices 300 on the second substrate 308, the micro devices 300 are transferred to the second roller 310. The second roller 310 includes a plurality of second protrusions 312. An adhesive layer 312a is coated on the surfaces of the second protrusions 312. In the side view (see FIG. 4C) in the first direction, it is observed that the pitch P3 of the second protrusions 312 in the second direction is N times of P2, and the pitch P4 of the second protrusions 312 in the first direction is M times of P1, wherein M is a positive real number larger than or equal to 1, and M may be a value equal to N. Furthermore, a width L2 of the second roller 310 may be determined by the total length of the second substrate 308 in the first direction, or the same as L1 to transfer of the micro devices 300 by repetitive picking/placing. Since the pitches between the second protrusions 312 of the second roller 310 itself has been expanded by N times and M times in both the first direction and the second direction, only the micro devices 300 having the pitch P3 will be transferred onto the second protrusions 312.

In the present embodiment, the adhesion force of the adhesive layer 312a is greater than the adhesion force of the adhesive layer 308a after being subjected to a light or heat stimulus, and the adhesion force may be an adhesive force, an electrostatic force, a pressure, or a Van der Waals force. For example, the adhesive layer 312a may use another adhesive material having a viscosity operation window different from that of the adhesive material of the adhesive layer 308a to pick up the micro devices 300 on the second substrate 308 by adhesion. One example is a pressure-sensitive adhesive having an adhesive force between the adhesive forces of the UV release film before light irradiation (before transfer) and after light irradiation. Through light irradiation to the UV release film, the adhesiveness of the adhesive layer 308a is reduced.

Figure 3F:
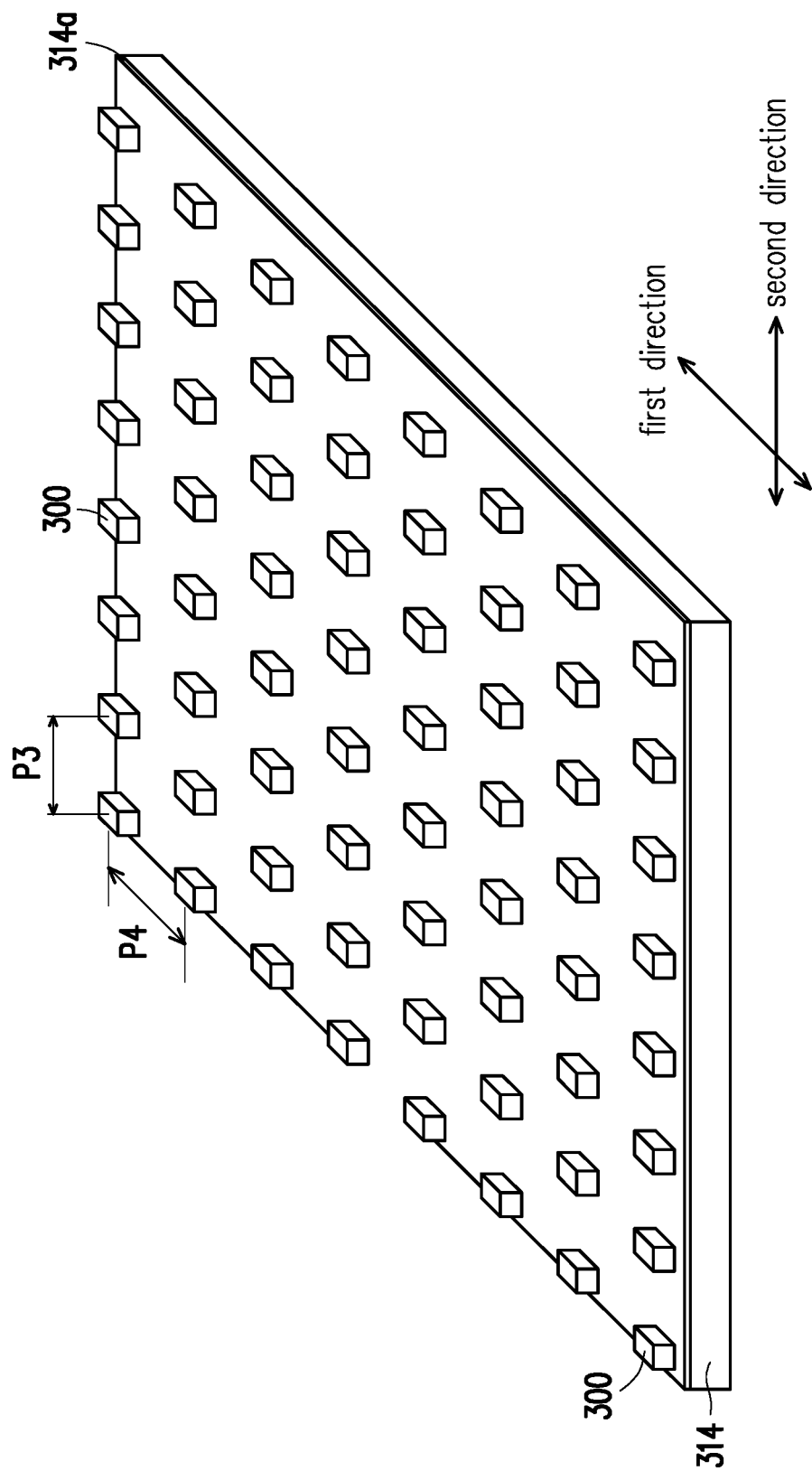

After the micro devices 300 are transferred to (the second protrusions 312 of) the second roller 310, referring to FIG. 3F, the micro devices 300 on the second roller 310 are transferred to a third substrate 314, which may be a temporary substrate or a product substrate. An adhesive layer 314a is coated on the surface of the third substrate 314. If the third substrate 314 is a temporary substrate, the material is selected, for example, to match the coefficient of thermal expansion (CTE) of the first substrate 302. For example, the first substrate 302 and the third substrate 314 may be formed of the same material. Alternatively, the third substrate 314 is a product substrate having circuits and electrodes. In the present embodiment, the adhesion force of the adhesive layer 314a is greater than the adhesion force of the adhesive layer 312a, and the adhesion force may be an adhesive force, an electrostatic force, a pressure, or a Van der Waals force. For example, when the third substrate 314 is a product substrate having circuits and electrodes, the adhesive layer 314a may use an ACF or an SAP as the adhesive material to simultaneously achieve adhesion, electrical conduction, and self-assembly positioning. On the other hand, if the third substrate 314 is a temporary substrate, the UV release film may be used, and transfer to another product substrate may be performed in a subsequent process. For example, the micro devices 300 on the third substrate 314 may be first attached to a glass substrate, and a UV light is irradiated from the backside of the third substrate 314 to reduce the adhesiveness of the UV release film. Then, the third substrate 314 is peeled off.

In summary of the process of the second embodiment, the apparatus for implementing the second embodiment at least includes the first substrate 302, the first roller 304, the second substrate 308 (i.e., the temporary substrate), the moving apparatus (not shown), and the second roller 310. Table 2 below shows material selections of the components in the exemplary solution where the transfer of the micro devices is controlled by the adhesive force. However, the disclosure is not limited thereto.

TABLE 2

| Component | Material | Requirement |
| --- | --- | --- |
| first substrate | non-deformable inorganic material, e.g., glass, silicon wafer, quartz | reducing variations in position of the micro devices thereon resulting from variations in environmental temperature or humidity |

TABLE 2-continued

| Component | Material | Requirement |
|---|---|---|
| adhesive layer between first substrate and micro devices | UV release film manufactured by Nan Ya Plastics Corporation, glass adhesive force before de-adhesion may be adjusted to be 500 gf/25 mm to 2500 gf/25 mm, and glass adhesive force after de-adhesion may be reduced to 30 gf/25 mm or below | adhesive force before de-adhesion being greater than adhesive force after de-adhesion |
| first roller | e.g., stainless steel, anodic aluminum oxide | dimensionally stable material matching coefficient of thermal expansion (CTE) of first substrate |
| contact line portions | polydimethylsiloxane (PDMS) (adhesive force: 50 gf/25 mm to 100 gf/25 mm) | elastomer |
| adhesive layer on contact line portions | oil-borne or water-borne acrylic pressure-sensitive adhesive | adhesive force being between adhesive forces of UV release film before light irradiation and after light irradiation |
| second substrate | glass, quartz | transparent, dimensionally stable |
| adhesive layer on second substrate | UV release film above | adhesive force being between adhesive forces of UV release film before light irradiation and after light irradiation |
| second roller | e.g., stainless steel, anodic aluminum oxide | dimensionally stable material matching coefficient of thermal expansion (CTE) of second substrate |
| second protrusions | PDMS | elastomer |
| adhesive layer on second protrusions | oil-borne or water-borne acrylic pressure-sensitive adhesive above | adhesive force being between adhesive forces of UV release film before light irradiation and after light irradiation |
| third substrate | glass, quartz | transparent, flexible, dimensionally stable |
|  | glass | transparent, dimensionally stable |
| adhesive layer on third substrate | UV release film above | adhesive force before de-adhesion being greater than adhesive force after de-adhesion |
|  | anisotropic conductive film (ACF) (peel strength at about 500 gf/cm) or Epowell AP series anisotropic conductive paste (SAP) (peel strength at about 4800 gf/cm) manufactured by Sekisui Chemical Co., Ltd. | conductive adhesive having adhesive force |

In summary of the above, the disclosure adopts the transfer technique of two-step rollers with the flat substrate to achieve pitch expansion and transfer of the micro devices in a simple and low-cost manner, which avoids the heavy time consumption of the picking/placing technique using linear motion combination.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A transfer method for expanding pitches of devices, comprising:
    providing a first substrate with a plurality of micro devices, wherein a pitch of the micro devices on the first substrate in a first direction and a second direction is both a predetermined value, and a first adhesive layer is provided between the first substrate and the micro devices;
    transferring the micro devices to a first roller by rolling the first roller to contact the micro devices on the first substrate, wherein the first roller comprises a plurality of contact line portions, a pitch of the contact line portions is N times of the predetermined value, and a second adhesive layer is provided on surfaces of the contact line portions;
    transferring the micro devices on the first roller to a second substrate, wherein a third adhesive layer is provided on a surface of the second substrate;
    rotating the second substrate by 90 degrees;
    transferring the micro devices to a second roller by rolling the second roller to contact the micro devices on the second substrate, wherein a fourth adhesive layer is provided on a surface of the second roller; and transferring the micro devices on the second roller to a third substrate, wherein a fifth adhesive layer is provided on a surface of the third substrate.

2. The transfer method for expanding pitches of devices according to claim 1, wherein a width of the contact line portion is equal to or greater than a width of the micro device.

3. The transfer method for expanding pitches of devices according to claim 1, wherein a height of the contact line portion is equal to or greater than a height of the micro device.

4. The transfer method for expanding pitches of devices according to claim 1, wherein a rolling speed of the first roller matches a speed at which the first substrate is moved in an extension direction of the contact line portions.

5. The transfer method for expanding pitches of devices according to claim 1, wherein each of the contact line portions is formed of a plurality of first protrusions or is a continuous line.

6. The transfer method for expanding pitches of devices according to claim 5, wherein a pitch of the first protrusions is equal to the predetermined value.

7. The transfer method for expanding pitches of devices according to claim 6, wherein the contact line portions are radially arranged on the first roller.

8. The transfer method for expanding pitches of devices according to claim 1, wherein the first roller and the second roller are different rollers.

9. The transfer method for expanding pitches of devices according to claim 8, wherein the contact line portions are axially arranged on the first roller.

10. The transfer method for expanding pitches of devices according to claim 8, wherein a width of the second roller is the N times of a width of the first roller, the second roller comprises a plurality of second protrusions, and a pitch of the second protrusions in the first direction is M times of the predetermined value, and a pitch of the second protrusions in the second direction is N times of the predetermined value.

11. The transfer method for expanding pitches of devices according to claim 1, wherein an adhesion force of the second adhesive layer is greater than an adhesion force of the first adhesive layer.

12. The transfer method for expanding pitches of devices according to claim 1, wherein an adhesion force of the third adhesive layer is greater than an adhesion force of the second adhesive layer.

13. The transfer method for expanding pitches of devices according to claim 1, wherein an adhesion force of the fourth adhesive layer is greater than an adhesion force of the third adhesive layer.

14. The transfer method for expanding pitches of devices according to claim 1, wherein an adhesion force of the fifth adhesive layer is greater than an adhesion force of the fourth adhesive layer.

15. The transfer method for expanding pitches of devices according to claim 1, wherein the first adhesive layer, the second adhesive layer, the third adhesive layer, the fourth adhesive layer, and the fifth adhesive layer each independently comprise a pressure-sensitive adhesive, a conductive solder paste, or an anisotropic conductive film, wherein the pressure-sensitive adhesive is a pressure-sensitive adhesive in which cross-linking reaction occurs or gas is generated to reduce an adhesive force after the pressure-sensitive adhesive is subjected to a light or heat stimulus.

16. The transfer method for expanding pitches of devices according to claim 1, wherein the third substrate comprises a temporary substrate or a product substrate.

17. The transfer method for expanding pitches of devices according to claim 1, wherein the first substrate and the third substrate are formed of the same material.

18. A transfer apparatus for expanding pitches of devices configured to transfer and expand a pitch of a plurality of micro devices located on a substrate, wherein the pitch of the micro devices in a first direction and a second direction is both a predetermined value, the apparatus comprising:
a first roller comprising a plurality of contact line portions, wherein a pitch of the contact line portions is N times of the predetermined value, and the first roller is configured to roll to contact the micro devices on the substrate for transferring the micro devices to the contact line portions;
a temporary substrate configured to carry the micro devices transferred from the contact line portions;
a moving apparatus configured to rotate the temporary substrate with the micro devices by 90 degrees; and
a second roller configured to roll to contact the micro devices on the temporary substrate for transferring the micro devices to the second roller.

19. The transfer apparatus for expanding pitches of devices according to claim 18, wherein a width of the contact line portion is equal to or greater than a width of the micro device.

20. The transfer apparatus for expanding pitches of devices according to claim 18, wherein a height of the contact line portion is equal to or greater than a height of the micro device.

21. The transfer apparatus for expanding pitches of devices according to claim 18, wherein a rolling speed of the first roller matches a speed at which the substrate is moved in an extension direction of the contact line portions.

22. The transfer apparatus for expanding pitches of devices according to claim 18, wherein each of the contact line portions is formed of a plurality of protrusions or is a continuous line.

23. The transfer apparatus for expanding pitches of devices according to claim 22, wherein a pitch of the first protrusions is equal to the predetermined value.

24. The transfer apparatus for expanding pitches of devices according to claim 18, wherein the first roller and the second roller are the same roller.

25. The transfer apparatus for expanding pitches of devices according to claim 24, wherein the contact line portions are radially arranged on the first roller.

26. The transfer apparatus for expanding pitches of devices according to claim 18, wherein the first roller and the second roller are different rollers.

27. The transfer apparatus for expanding pitches of devices according to claim 26, wherein the contact line portions are axially arranged on the first roller.

28. The transfer apparatus for expanding pitches of devices according to claim 26, wherein a width of the second roller is the N times of a width of the first roller, the second roller comprises a plurality of second protrusions, a pitch of the second protrusions in the first direction is M times of the predetermined value, and a pitch of the second protrusions in the second direction is N times of the predetermined value.

29. The transfer apparatus for expanding pitches of devices according to claim 18, further comprising:
a first adhesive layer disposed between the substrate and the micro devices;

a second adhesive layer disposed on surfaces of the contact line portions;

a third adhesive layer disposed on a surface of the temporary substrate; and a fourth adhesive layer disposed on a surface of the second roller.

30. The transfer apparatus for expanding pitches of devices according to claim 29, wherein an adhesion force of the second adhesive layer is greater than an adhesion force of the first adhesive layer.

31. The transfer apparatus for expanding pitches of devices according to claim 29, wherein an adhesion force of the third adhesive layer is greater than an adhesion force of the second adhesive layer.

32. The transfer apparatus for expanding pitches of devices according to claim 29, wherein an adhesion force of the fourth adhesive layer is greater than an adhesion force of the third adhesive layer.

33. The transfer apparatus for expanding pitches of devices according to claim 30, wherein the adhesion force comprises an adhesive force, an electrostatic force, a pressure, or a Van der Waals force.

34. The transfer apparatus for expanding pitches of devices according to claim 31, wherein the adhesion force comprises an adhesive force, an electrostatic force, a pressure, or a Van der Waals force.

35. The transfer apparatus for expanding pitches of devices according to claim 32, wherein the adhesion force comprises an adhesive force, an electrostatic force, a pressure, or a Van der Waals force.

36. The transfer apparatus for expanding pitches of devices according to claim 29, wherein the first adhesive layer, the second adhesive layer, the third adhesive layer, and the fourth adhesive layer each independently comprise a pressure-sensitive adhesive, a conductive solder paste, or an anisotropic conductive film, wherein the pressure-sensitive adhesive is a pressure-sensitive adhesive in which cross-linking reaction occurs or gas is generated to reduce an adhesive force after the pressure-sensitive adhesive is subjected to a light or heat stimulus.

* * * * *